(12) United States Patent
Meng

(10) Patent No.: US 12,224,234 B2
(45) Date of Patent: Feb. 11, 2025

(54) MANUFACTURING METHOD OF METAL GRID, THIN FILM SENSOR AND MANUFACTURING METHOD OF THIN FILM SENSOR

(71) Applicants: Beijing BOE Technology Development Co., Ltd., Beijing (CN); BOE TECHNOLOGY GROUP CO., LTD., Beijing (CN)

(72) Inventor: Hu Meng, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 478 days.

(21) Appl. No.: 17/629,358

(22) PCT Filed: Mar. 15, 2021

(86) PCT No.: PCT/CN2021/080873
§ 371 (c)(1),
(2) Date: Jan. 21, 2022

(87) PCT Pub. No.: WO2022/193099
PCT Pub. Date: Sep. 22, 2022

(65) Prior Publication Data
US 2023/0163059 A1 May 25, 2023

(51) Int. Cl.
*H01L 23/498* (2006.01)
*H01L 21/02* (2006.01)
(Continued)

(52) U.S. Cl.
CPC .. *H01L 23/49838* (2013.01); *H01L 21/02164* (2013.01); *H01L 21/0217* (2013.01);
(Continued)

(58) Field of Classification Search
None
See application file for complete search history.

(56) References Cited

U.S. PATENT DOCUMENTS 6,370,306 B1 * 4/2002 Sato ............... G01Q 60/38
385/32
2002/0182857 A1 * 12/2002 Liu ............... H01L 21/76807
438/645
(Continued)

FOREIGN PATENT DOCUMENTS

CN 102054752 A 5/2011
CN 104377191 A 2/2015
(Continued)

*Primary Examiner* — Nishath Yasmeen
(74) *Attorney, Agent, or Firm* — HOUTTEMAN LAW LLC

(57) ABSTRACT

A manufacturing method of a metal grid includes: providing a base substrate; forming a pattern including a first dielectric layer on the base substrate through a patterning process such that the first dielectric layer has a first groove in a lattice shape; forming a second dielectric layer on a side of the first dielectric layer away from the base substrate such that the second dielectric layer is deposited at least on a sidewall of the first groove to form a second groove in a lattice shape; and forming a metal material in the second groove, and removing at least a part of a material of the second dielectric layer such that an orthographic projection of the part of the material of the second dielectric layer on the base substrate does not overlap with an orthographic projection of the metal material on the base substrate, to form a metal grid.

12 Claims, 7 Drawing Sheets

(51) Int. Cl.
  *H01L 21/288*   (2006.01)
  *H01L 21/311*   (2006.01)
  *H01L 21/3205*  (2006.01)
  *H01L 21/3213*  (2006.01)
  *H01L 21/56*    (2006.01)

(52) U.S. Cl.
  CPC ...... *H01L 21/02282* (2013.01); *H01L 21/288* (2013.01); *H01L 21/31116* (2013.01); *H01L 21/31138* (2013.01); *H01L 21/32051* (2013.01); *H01L 21/32135* (2013.01); *H01L 21/56* (2013.01)

(56) References Cited

U.S. PATENT DOCUMENTS

| | | | |
|---|---|---|---|
| 2007/0148972 | A1 | 6/2007 | Hara |
| 2009/0136657 | A1 | 5/2009 | Slafer |
| 2014/0302683 | A1* | 10/2014 | Kikuchi .............. H01L 21/3065 438/719 |
| 2018/0045866 | A1* | 2/2018 | Chae ................ G02F 1/133553 |
| 2020/0251510 | A1* | 8/2020 | Ge .................... H01L 27/14621 |

FOREIGN PATENT DOCUMENTS

| | | | |
|---|---|---|---|
| CN | 110098211 | * | 8/2019 |
| CN | 110098211 | A | 8/2019 |
| CN | 111370410 | A | 7/2020 |

* cited by examiner

MANUFACTURING METHOD OF METAL GRID, THIN FILM SENSOR AND MANUFACTURING METHOD OF THIN FILM SENSOR

TECHNICAL FIELD

The present disclosure relates to a technical field of electronic devices, and particularly relates to a manufacturing method of a metal grid, a thin film sensor and a manufacturing method of the thin film sensor.

BACKGROUND

At present, a line width in a micro-nano processing technology commonly used in glass-based semiconductor industry is about 2 to 3 μm. Some thin film display and sensing devices, such as a transparent antenna or a radio frequency device, put forward higher requirements on the line width in the micro-nano processing technology. The transparent antenna mainly uses a metal grid with a narrow line width as a signal transmitting and receiving unit, while the radio frequency device applies a narrower channel to achieve a higher cut-off frequency.

SUMMARY

The present invention aims to solve at least one technical problem in the related art, and provides a manufacturing method of a metal grid, a thin film sensor and a manufacturing method thereof.

In a first aspect, an embodiment of the present disclosure provides a manufacturing method of a metal grid, including:
providing a base substrate;
forming a pattern including a first dielectric layer on the base substrate through a patterning process, such that the first dielectric layer has a first groove in a lattice shape;
forming a second dielectric layer on a side of the first dielectric layer away from the base substrate, such that the second dielectric layer is deposited at least on a sidewall of the first groove to form a second groove in a lattice shape; and
forming a metal material in the second groove, and removing at least a part of a material of the second dielectric layer such that an orthographic projection of the part of the material of the second dielectric layer on the base substrate does not overlap with an orthographic projection of the metal material on the base substrate, to form a metal grid.

The forming a pattern including a first dielectric layer on the base substrate through a patterning process includes:
forming a first material layer and a second material layer on the base substrate sequentially;
patterning the second material layer to form a sacrificial layer having a lattice-shaped hollow out pattern;
removing a part of a first material of the first material layer at a position corresponding to the lattice-shaped hollow out pattern of the sacrificial layer through a patterning process; and
removing the sacrificial layer to form the first dielectric layer.

The first material layer includes a low-temperature organic curing adhesive; the forming a first material layer and a second material layer on the base substrate includes:
coating the low-temperature organic curing adhesive on the base substrate by a spin coating method, and curing the low-temperature organic curing adhesive; and
depositing a second material of the second material layer on a side of the cured low-temperature organic curing adhesive away from the base substrate.

The forming a metal material in the second groove includes:
forming a metal film layer as a seed layer on a side of the second dielectric layer away from the base substrate;
performing an electroplating process on the seed layer to form a metal material both in the second groove and on a side of the second dielectric layer away from the base substrate; and
removing at least a part of the metal material outside the second groove.

The removing at least a part of the metal material outside the second groove includes:
removing the part of the metal material outside the second groove, and removing a part of the metal material with a predetermined thickness in the second groove.

The forming a metal material in the second groove includes:
forming a metal film layer on a side of the second dielectric layer away from the base substrate, through an evaporation process; and
removing at least a part of the metal material outside the second groove by an etching process.

The forming a metal material in the second groove includes:
forming a metal film layer on the base substrate as a seed layer before the step of forming a pattern including a first dielectric layer on the base substrate through a patterning process;
forming a protective layer on a side of the seed layer away from the base substrate;
after the forming a second dielectric layer on a side of the first dielectric layer away from the base substrate, removing a bottom wall of the second groove and a part of the protective layer at a position of the bottom wall of the second groove; and
performing an electroplating process on the seed layer to form the metal material in the second groove.

The removing at least a part of a material of the second dielectric layer such that an orthographic projection of the part of the material of the second dielectric layer on the base substrate does not overlap with an orthographic projection of the metal material on the base substrate includes:
removing a part of the second dielectric layer such that an orthographic projection of the part of the material of the second dielectric layer on the base substrate does not overlap with an orthographic projection of the metal material on the base substrate, by wet etching; and
removing the first dielectric layer by dry etching.

After forming the metal grid, the manufacturing method in an embodiment of according to the present disclosure further includes:
forming a passivation layer on a side of the metal grid away from the base substrate. The first dielectric layer has a thickness of 2 μm to 3 μm.

The first groove in the first dielectric layer has a width of 3 μm to 4 μm and a depth of 2 μm to 3 μm.

A width of the second groove is not greater than 1.5 μm.

In a second aspect, an embodiment of the present disclosure provides a manufacturing method of a thin film sensor, including the above manufacturing method of a metal grid.

In a third aspect, an embodiment of the present disclosure provides a thin film sensor, including:
a base substrate;
a second dielectric layer arranged on the base substrate;
a metal grid arranged on a side of the second dielectric layer away from the base substrate, wherein an orthographic projection of the metal grid on the base substrate is within an orthographic projection of the second dielectric layer on the base substrate.

A thickness of the metal grid is not less than a thickness of the first dielectric layer.

A line width of the metal grid is not greater than 2 μm.

DETAIL DESCRIPTION OF EMBODIMENTS

In order to make the technical solutions of the present disclosure better understood by those skilled in the art, the present disclosure is further described in detail below with reference to the accompanying drawings and specific embodiments.

Unless defined otherwise, technical or scientific terms used herein shall have the ordinary meaning as understood by those of general skills in the art to which the present disclosure belongs. The words "first", "second", and the like used in the present disclosure are not intended to indicate any order, quantity, or importance, but rather are used to distinguish one element from another. Also, the word "a", "an", "the" or the like does not denote a quantity limitation, but rather denotes the presence of at least one. The word "comprising", "including", "includes", "comprises", or the like means that the element or item preceding the word includes the element or item listed after the word and its equivalent, but does not exclude other elements or items. The word "connected", "coupled" or the like is not restricted to a physical or mechanical connection, but may include an electrical connection, whether direct or indirect. The words "upper", "lower", "left", "right", and the like are used only to indicate relative positional relationships, and when the absolute position of the object being described is changed, the relative positional relationships may also be changed accordingly.

Figure 1:
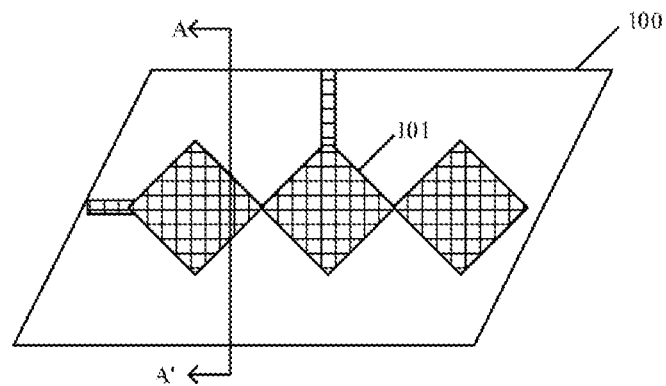
FIG. 1 is a schematic diagram of a structure of a thin film sensor according to an embodiment of the present disclosure.
Figure 2:
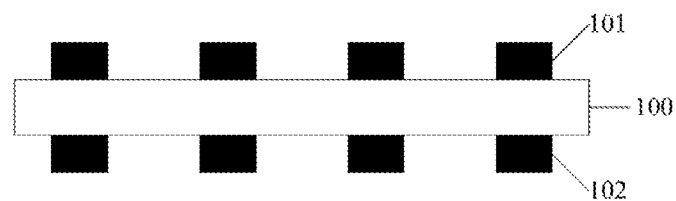
FIG. 2 is a cross-sectional view of a structure of the film sensor in FIG. 1 taken along a line A-A'.

FIG. 1 is a schematic diagram of a structure of an exemplary thin film sensor. FIG. 2 is a cross-sectional view of the structure of the thin film sensor as shown in FIG. 1 along a line A-A. As shown in FIGS. 1 and 2, the thin film sensor includes: a base substrate 100 having a first surface and a second surface, i.e., an upper surface and a lower surface, oppositely disposed; and a first conductive layer 101 and a second conductive layer 102 which are respectively located on the first surface and the second surface of the base substrate 100. Taking the film sensor being a transparent antenna as an example, the first conductive layer 101 may be a radiation layer, and the second conductive layer 102 may be a ground layer. The radiation layer may be used as a receiving unit of an antenna structure, and may also be used as a transmitting unit of the antenna structure.

In order to ensure that the first conductive layer 101 and the second conductive layer 102 have good light transmittance, the first conductive layer 101 and the second conductive layer 102 need to be patterned. For example, the first conductive layer 101 may be formed by grid wires made of a metal material, and the second conductive layer 102 may also be formed by grid wires made of a metal material. It is understood that the first conductive layer 101 and the second conductive layer 102 may alternatively be formed by a structure of other patterns, for example, by block electrodes of diamond, triangle, etc., which are not listed herein. As can be seen from FIG. 1, the first conductive layer 101 and the second conductive layer 102, i.e., the grid wires, are not entirely provided on both surfaces of the base substrate 100. Any grid wire is formed by metal grids electrically connected with each other. Due to the material and the forming process of the metal grid, a line width of the metal grid is large, light transmittance of the film sensor is seriously influenced, and user's experience is influenced.

It should be noted that the above metal grid is not limited to be applied in an antenna structure, and may alternatively be applied in a touch panel to function as a touch electrode. Of course, the metal grid may alternatively be used in various applications using the metal wires, which are not listed herein.

In order to solve the above technical problem, a manufacturing method of a metal grid is provided in an embodiment of the present disclosure. In an embodiment of the present disclosure, the metal grid is only applied to an antenna as a receiving unit and/or a transmitting unit of the antenna, as an example, but it should be understood that this does not limit the scope of the embodiment of the present disclosure.

Figure 3:
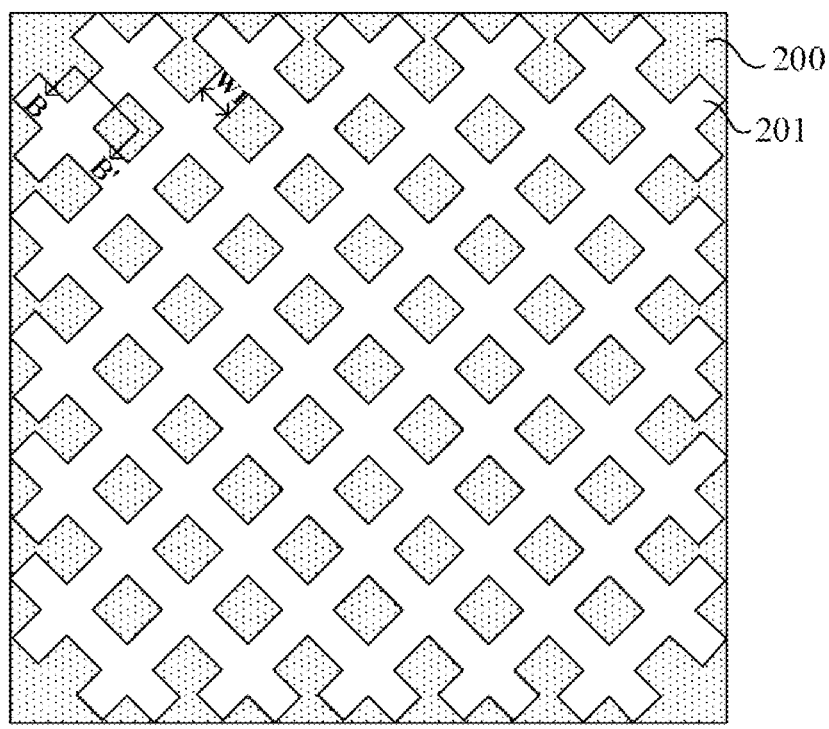
FIG. 3 illustrates a top view of an intermediate product formed in a step S2 of a manufacturing method of a metal grid according to an embodiment of the present disclosure.
Figure 4:
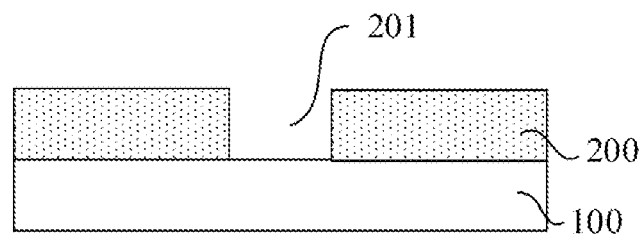
FIG. 4 is a cross-sectional view of a structure of the intermediate product in FIG. 3 taken along a line B-B'.
Figure 5:
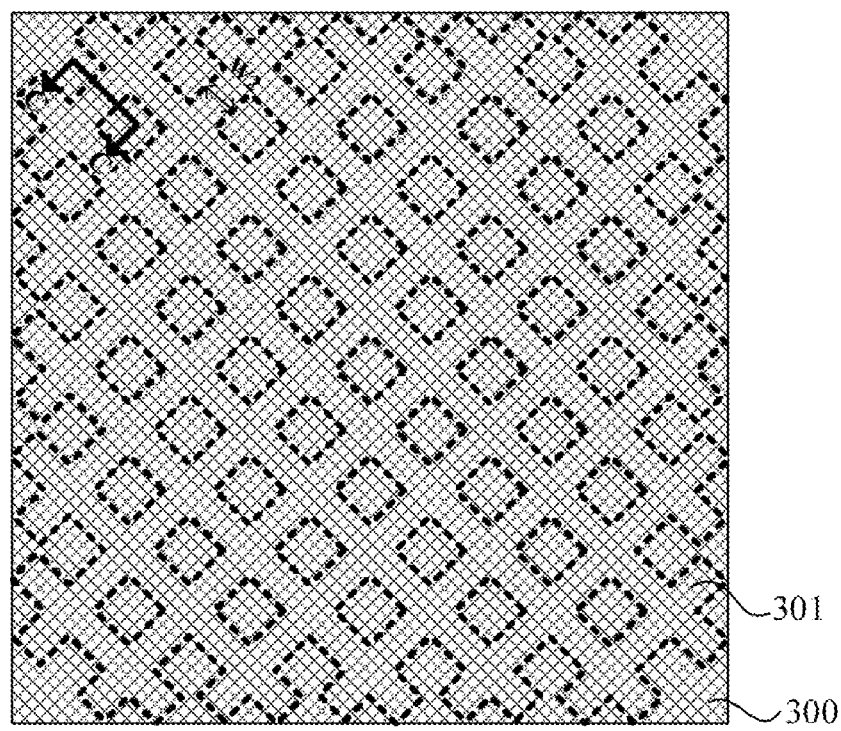
FIG. 5 illustrates a top view of an intermediate product formed in a step S3 of the manufacturing method of a metal grid according to an embodiment of the present disclosure.
Figure 6:
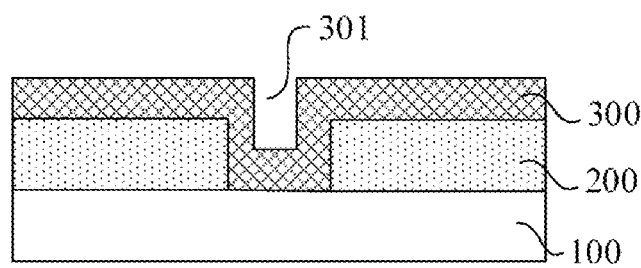
FIG. 6 is a cross-sectional view of a structure of the intermediate product in FIG. 5 taken along a line C-C'.
Figure 7:
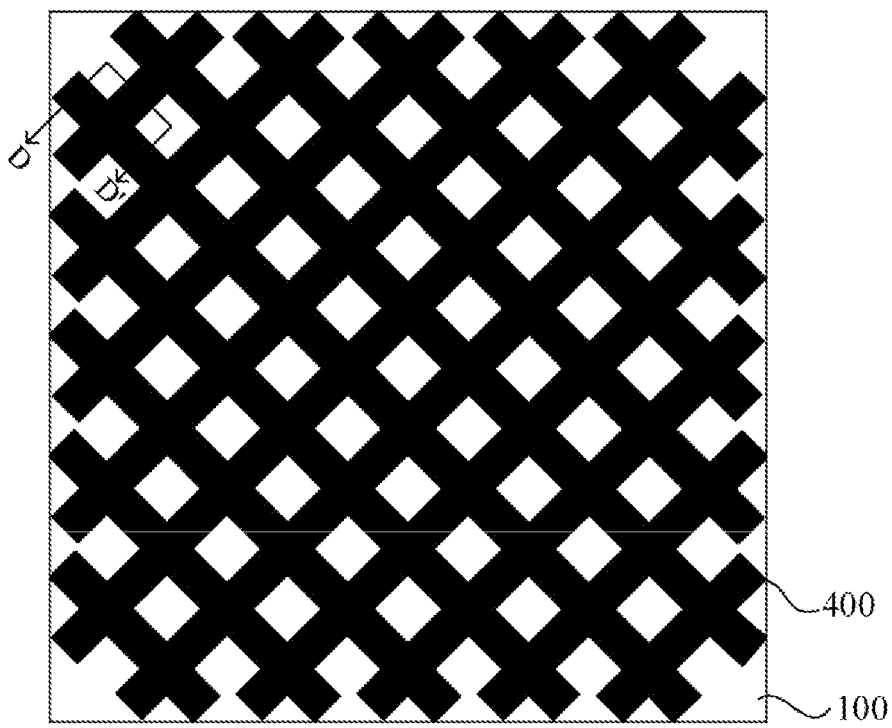
FIG. 7 illustrates a top view of the metal grid formed in a step S4 of the manufacturing method of a metal grid according to an embodiment of the present disclosure.
Figure 8:
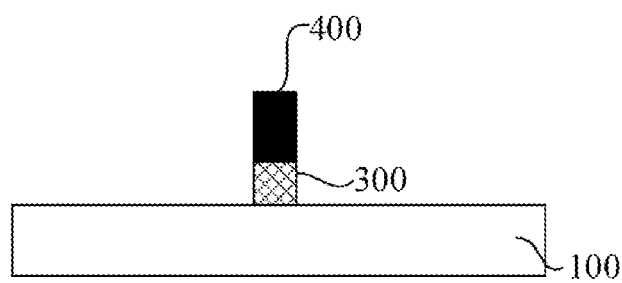
FIG. 8 is a cross-sectional view of a structure of the formed metal grid as shown in FIG. 7 along a line D-D'.

FIG. 3 illustrates a top view of an intermediate product formed in a step S2 of a manufacturing method of a metal grid in an embodiment of the present disclosure. FIG. 4 is a cross-sectional view of a structure of the intermediate product obtained during forming the metal grid as shown in FIG. 3 along a line B-B'. FIG. 5 illustrates a top view of an intermediate product formed in a step S3 of the manufacturing method of a metal grid in an embodiment of the present disclosure. FIG. 6 is a cross-sectional view of a structure of the intermediate product obtained during forming the metal grid as shown in FIG. 5 along a line C-C'. FIG. 7 illustrates a top view of the metal grid formed in a step S4 of the manufacturing method of a metal grid in an embodiment of the present disclosure. FIG. 8 is a cross-sectional view of a structure of the formed metal grid as shown in FIG. 7 along a line D-D'.

In a first aspect, as shown in FIGS. 3 to 8, in an embodiment of the present disclosure, a manufacturing method of a metal grid 400 is provided, and includes the following steps:

S1, providing a base substrate 100.

In some embodiments, the base substrate 100 may be a flexible film, and the flexible film may include at least one of a COP film, a Polyimide (PI) material, or a polyethylene terephthalate (PET) material. In such a case, in S1, the flexible COP film may be attached to a glass substrate through a transparent optical adhesive (OCA adhesive), and then the glass substrate on which the COP film is formed may be cleaned.

S2, forming a pattern including a first dielectric layer 200 on the base substrate 100 through a patterning process such that the first dielectric layer 200 has a first groove 201 in a lattice shape, and a width of the first groove 201 is a first width W1, as shown in FIGS. 3 and 4.

The first groove 201 may be a through slot penetrating through the first dielectric layer 200, or may be a blind slot penetrating the first dielectric layer 200 by a certain thickness. In an embodiment of the present disclosure, the first groove 201 is described as the through slot as shown in FIG. 3, as an example. In some examples, the first dielectric layer 200 may be an organic curing adhesive that may be cured at a low temperature, and has a thickness of about 2.5 μm to about 3.5 μm. The width W1 of the first groove 201 in the first dielectric layer 200 is about 3 μm to 4 μm, and a corresponding depth is about 2 μm to 3 μm, and a specific depth of the first groove 201 depends on the thickness of the first dielectric layer 200. Certainly, in an embodiment of the present disclosure, the first dielectric layer 200 is not limited to the organic curing adhesive, and may alternatively be made of an insulating dielectric layer material such as silicon oxide and silicon nitride. The reason that the organic curing adhesive is used as the material of the first dielectric layer 200 in an embodiment of the present disclosure is to ensure that a sidewall of the formed first groove 201 is perpendicular to a surface of the base substrate 100, which facilitates a uniform line width of the metal grid 400 formed subsequently.

S3, a second dielectric layer 300 is formed on a side of the first dielectric layer 200 away from the base substrate 100, and the second dielectric layer 300 is deposited at least on the sidewall of the first groove 201 to form a second groove 301 in a lattice shape, as shown in FIGS. 5 and 6.

As shown in FIG. 6, the second groove 301 is actually a blind slot defined by the second dielectric layer 300 deposited on the sidewall of the first groove 201. A width of the second groove 301 is a second width W2, and obviously the second width W2 is smaller than the first width W1, and the second width W2 of the blind slot is determined by a thickness of the formed second dielectric layer 300. In an embodiment of the present disclosure, the second dielectric layer 300 may be deposited only on the sidewall of the first groove 201, or may be deposited not only on the sidewall of the first groove 201, but also on the surface of the first dielectric layer 200 away from the base substrate 100, that is, an orthographic projection of the second dielectric layer 300 on the base substrate 100 covers the base substrate 100. In some examples, the second dielectric layer 300 is deposited to a thickness such that a groove width of the first groove 201 is reduced from 3-4 μm to less than 2.0 μm, i.e., the second width W2 of the second groove 301 formed by the second dielectric layer 300 is not greater than 1.5 μm. In some examples, the second dielectric layer 300 may be a single layer structure of a silicon oxide film or a silicon nitride film, or a composite film of a silicon oxide film and a silicon nitride film.

S4, forming a metal material in the second groove 301, and removing a part of the first dielectric layer 200 and a part of the second dielectric layer 300 having an orthographic projection on the base substrate 100 not overlapping an orthographic projection of the metal material on the base substrate 100, to obtain the metal grid 400, as shown in FIGS. 7 and 8.

In some examples, the metal material includes, but is not limited to, one or more of copper, titanium, aluminum and silver. A line width of the metal grid 400 formed in an embodiment of the present disclosure is 1.5 μm or less, where the line width of the metal grid 400 refers to a width of a metal line formed of a metal material formed in the second groove 301, and the width of the metal line is equal to or substantially equal to the second width of the second groove 301.

The metal grid 400 is thus obtained.

In the manufacturing method in an embodiment of the present disclosure, the second dielectric layer 300 is deposited on the sidewall of the first groove 201 to reduce a width of the first groove 201, that is, to form the second groove 301 (a width of the groove is changed from the first width W1 to the second width W2, W2 being smaller than W1), and then the metal material is formed in the second groove 301. At this time, the line width of the formed metal grid 400 is narrower, and the metal grid 400 is applied to the thin film sensor, which is helpful for improving light transmittance of the product.

Figure 9:
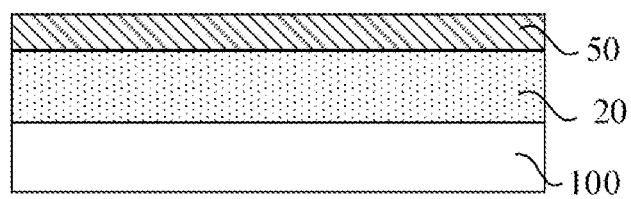
FIG. 9 is a cross-sectional view of a structure of an intermediate product formed in a step S21 of the manufacturing method of a metal grid according to an embodiment of the present disclosure.
Figure 10:
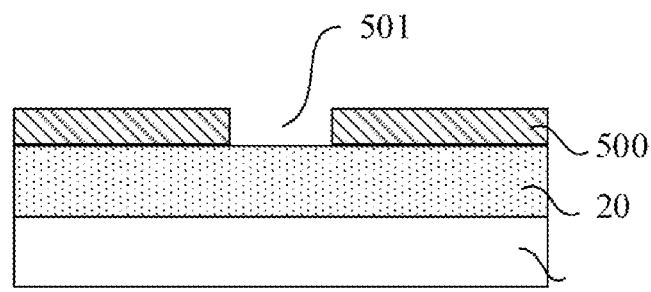
FIG. 10 is a cross-sectional view of a structure of an intermediate product formed in a step S22 of the manufacturing method of a metal grid according to an embodiment of the present disclosure.
Figure 11:
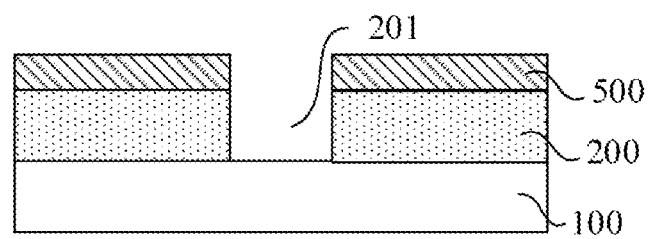
FIG. 11 is a cross-sectional view of a structure of an intermediate product formed in a step S23 of the manufacturing method of a metal grid according to an embodiment of the present disclosure.

In some examples, the step S2 of the forming a pattern including the first dielectric layer 200 on the base substrate 100 such that the first dielectric layer 200 has the first groove 201 in a lattice shape may be specifically implemented as follows. FIG. 9 is a cross-sectional view of a structure of an intermediate product formed in a step S21 of the manufacturing method of a metal grid 400 in an embodiment of the present disclosure. FIG. 10 is a cross-sectional view of a structure of an intermediate product formed in a step S22 of a manufacturing method of a metal grid 400 in an embodiment of the present disclosure. FIG. 11 is a cross-sectional view of structure of an intermediate product formed in a step S23 of the manufacturing method of a metal grid 400 in an embodiment of the present disclosure.

S21, forming a first material layer 20 and a second material layer 50 on the base substrate 100 sequentially, as shown in FIG. 9.

A material of the first material layer 20 includes, but is not limited to, a low temperature organic curing adhesive. A material of the second material layer 50 includes, but is not limited to, a transparent conductive metal, such as ITO (indium tin oxide). In an embodiment of the present disclosure, to be described as an example, the material of the first material layer 20 is the low temperature organic curing adhesive, and the material of the second material layer 50 is ITO.

Step S21 may specifically include: first, forming a low temperature organic curing adhesive with a thickness of about 2 μm to 3 μm on the base substrate 100 by a spin coating method, and curing the low temperature organic curing adhesive at 110° C. to 150° C., specifically, it may be 130° C. Next, an ITO material layer with a thickness of about 50 nm to 80 nm (e.g., 70 nm) is formed on a side of the low temperature organic curing adhesive away from the base substrate 100 by, but not limited to, a sputtering process.

S22, patterning the second material layer 50 to form a sacrificial layer 500 having a lattice-shaped hollow out pattern 501, as shown in FIG. 10.

Step S22 may specifically include forming a photoresist on the second material layer 50, that is, on a side of the ITO material layer away from the base substrate 100, and then performing exposure, development, and etching processes to form the sacrificial layer 500 having the lattice-shaped hollow out pattern 501.

S23, removing the material of the first material layer 20 at a position corresponding to the lattice-shaped hollow out pattern 501 of the sacrificial layer 500 through a patterning process, as shown in FIG. 11.

Step S23 may specifically include removing the low temperature organic curing adhesive (the material of the first material layer 20) at the position of the lattice-shaped hollow out pattern 501 by dry etching.

S24, removing the sacrificial layer 500 to form the first dielectric layer 200, as shown in FIGS. 3 and 4.

Step S24 may specifically include removing the sacrificial layer 500 by wet etching, that is, removing the remaining ITO material, so as to form the first dielectric layer 200 having the first groove 201.

In an embodiment of the present disclosure, the sacrificial layer 500 is used as a mask for forming the first groove 201, so that damage to a side edge of the first groove 201 when the organic curing adhesive is etched can be effectively avoided, and the depth of the first groove 201 can be ensured.

Figure 12:
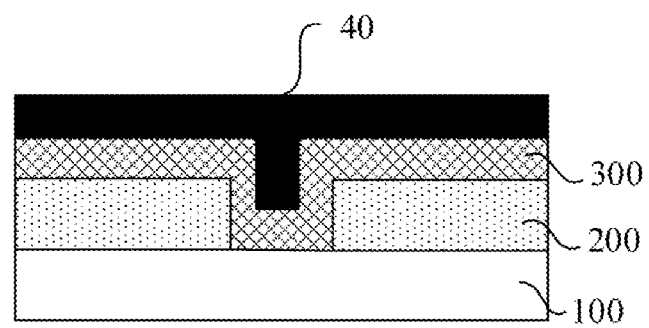
FIG. 12 is a cross-sectional view of a structure of an intermediate product formed in a step S42 of the manufacturing method of a metal grid according to an embodiment of the present disclosure.

In some examples, in the step S4, the forming a metal material in the second groove 301, and removing a part of the first dielectric layer 200 and a part of the second dielectric layer 300 having an orthographic projection on the base substrate 100 not overlapping an orthographic projection of the metal material on the base substrate 100, to obtain the metal grid 400 may specifically be implemented as follows. In this case, as an example, the formed metal grid 400 is a titanium/copper laminated structure. FIG. 12 is a cross-sectional view of a structure of an intermediate product formed in a step S42 of a manufacturing method of a metal grid 400 in an embodiment of the present disclosure.

Figure 13:
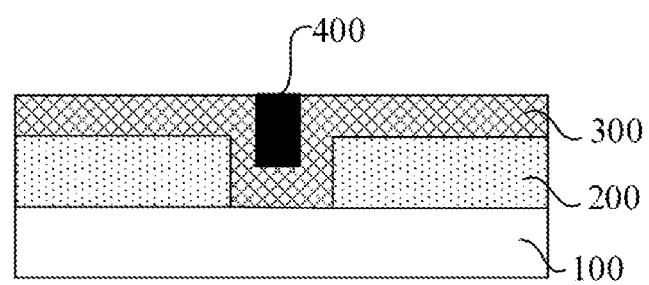
FIG. 13 is a cross-sectional view of a structure of an intermediate product formed in a step S43 of the manufacturing method of a metal grid according to an embodiment of the present disclosure.

FIG. 13 is a cross-sectional view of a structure of an intermediate product formed in a step S43 of the manufacturing method of a metal grid 400 in an embodiment of the present disclosure.

S41, sequentially depositing a titanium film and a copper film on a side of the second dielectric layer 300 away from the base substrate 100 by a sputtering process, i.e. forming a metal film layer 40.

It should be noted that only one copper film may be deposited in this step, and the titanium film is used to increase the adhesion of the copper film.

S42, performing an electroplating process with the metal film layer 40 as a seed layer, as shown in FIG. 12.

Step S42 specifically includes: placing the base substrate 100 on a carrier of an electroplating machine, with a side of the base substrate 100 having the second dielectric layer 300 facing the carrier; pressing a power-on pad on the second dielectric layer 300; placing the base substrate in a hole-filling electroplating bath (with a dedicated hole-filling electrolyte in the bath); applying a current such that the electroplating solution keeps flowing continuously and rapidly on the surface of the base substrate 100, and cations in the electroplating solution on the sidewall of the second groove 301 obtain electrons to become atoms to be deposited on the sidewall. Through the dedicated hole-filling electrolyte with a special ratio, the metal copper may be deposited mainly in the second groove 301 at a high speed (deposition speed of 0.5 μm/min to 3 μm/min), while the deposition speed of the metal copper on the second dielectric layer 300 is quite low (0.005 μm/min to 0.05 μm/min). As time elapses, the metal copper on the sidewall of the second groove 301 gradually grows thick, and even the second groove 301 may be completely filled, and finally the base substrate 100 is taken out and subjected to deionized water cleaning.

S43, the metal material outside the second groove 301 is removed by a copper etching solution, as shown in FIG. 13.

Of course, in step S43, the metal material outside the second groove 301 may be removed by dry etching.

S44, removing a part of the second dielectric layer 300 having an orthographic projection on the base substrate 100 notoverlapping an orthographic projection of the metal material on the base substrate 100 by wet etching.

S45, removing the first dielectric layer 200 by dry etching, i.e. the metal grid 400 is formed, as shown in FIGS. 8 and 9.

Figure 14:
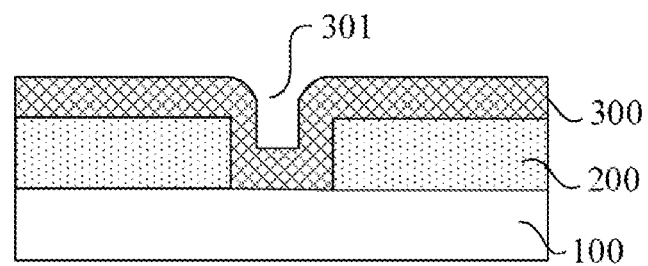
FIG. 14 is a cross-sectional view of a structure of the intermediate product during forming the metal grid as shown in FIG. 5 along a line C-C'.
Figure 15:
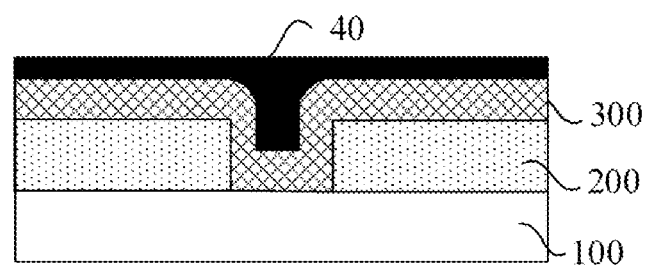
FIG. 15 is a cross-sectional view of a structure of the intermediate product formed in the step S42 of the manufacturing method of a metal grid according to an embodiment of the present disclosure.
Figure 16:
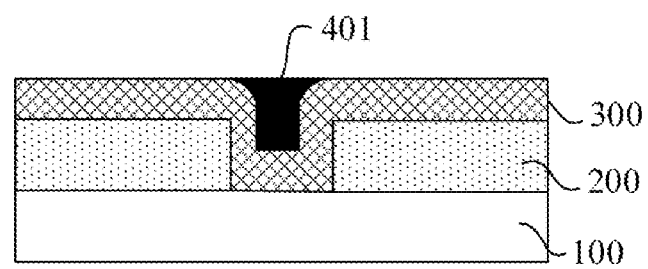
FIG. 16 is a cross-sectional view of a structure of the intermediate product formed in the step S43 of the manufacturing method of a metal grid according to an embodiment of the present disclosure.
Figure 17:
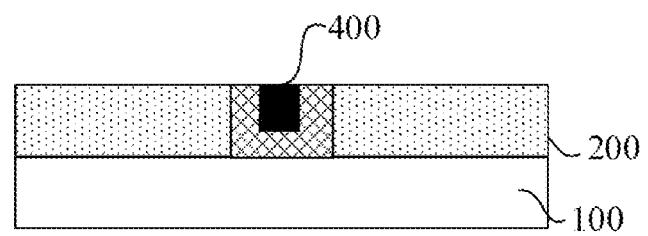
FIG. 17 is a cross-sectional view of a structure of an intermediate product formed in a step S47 of the manufacturing method of a metal grid according to an embodiment of the present disclosure.

In some embodiments, FIG. 14 is a cross-sectional view of a structure of the intermediate product obtained during forming the metal grid as shown in FIG. 5 along a line C-C'. As shown in FIG. 14, due to the process, a second dielectric layer 300 is formed on a side of the first dielectric layer 200 having the first groove 201 away from the base substrate 100, a thickness of the second dielectric layer 300 deposited on the sidewall of the first groove 201 is not constant, and obviously in a direction away from the base substrate 100, the thickness of the second dielectric layer 200 deposited on the sidewall of the first groove 201 becomes thinner gradually, so that the groove width of the formed second groove 301 is not uniform. As shown in FIG. 14, the width of the second groove 301 at an end away from the base substrate 100 is significantly greater than the width at an end close to the base substrate 100. In this case, in some examples, the step S4 include not only the above-described steps S41-43 but also the following steps S46 and S47. Since the width of the second groove 301 at the end away from the base substrate 100 is significantly larger than the width at the end close to the base substrate 100, in the electroplating process of the step S42, the metal material formed in the second groove 301 also has a width at the end away from the base substrate 100 that is significantly larger than the width at the end close to the base substrate 100, as shown in FIG. 15. The structure formed in the step S43 is shown in FIG. 17. The following specifically describes steps S46 and S47.

S46, removing a part of the material of the second dielectric layer 300 on a side of the first dielectric layer 200 away from the base substrate 100 by wet etching or an ashing process.

S47, removing a part of the metal material with a predetermined thickness in the second groove 301 by using the copper etching solution, as shown in FIG. 17.

It should be noted that the predetermined thickness should be a difference between the thickness of the metal material formed in the second groove 301 in the step S42 and the thickness of the metal grid 400 to be formed.

In addition, the metal film layer 40 on the surfaces of the second groove 301 and the second dielectric layer 300 is formed on the second dielectric layer 300 through sputtering and plating processes as above. In some examples, the metal film layer 40 may alternatively be formed on the surfaces of the second groove 301 and the second dielectric layer 300 through an evaporation process.

In an embodiment of the present disclosure, after obtaining the metal grid 400, the manufacturing method further includes forming a passivation layer 500 on a side of the metal grid 400 away from the base substrate to protect the metal grid 400, so as to prevent the metal grid 400 from being corroded by water and oxygen.

Figure 19:
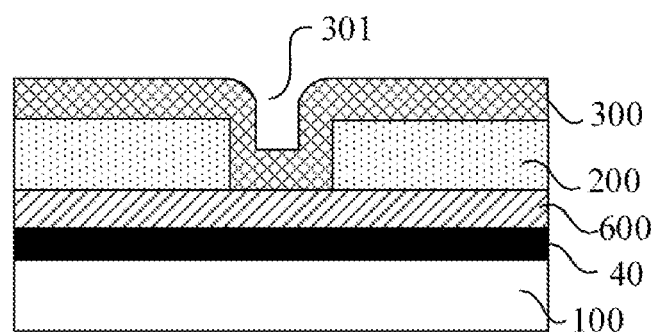
FIG. 19 is a cross-sectional view of a structure of an intermediate product formed in a step S04 of the manufacturing method of a metal grid according to an embodiment of the present disclosure.
Figure 20:
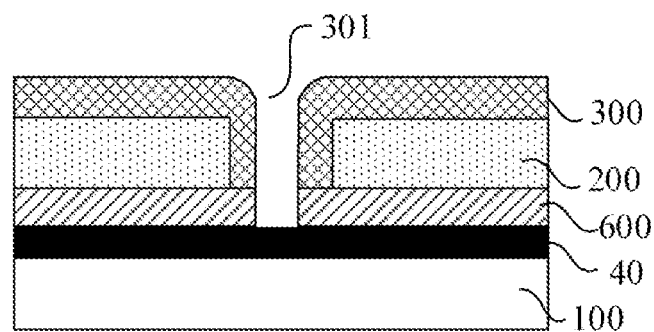
FIG. 20 is a cross-sectional view of a structure of an intermediate product formed in a step S05 of the manufacturing method of a metal grid according to an embodiment of the present disclosure.
Figure 21:
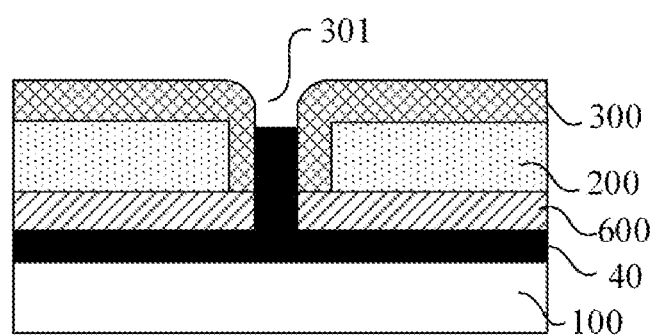
FIG. 21 is a cross-sectional view of a structure of an intermediate product formed in a step S06 of the manufacturing method of a metal grid according to an embodiment of the present disclosure.
Figure 22:
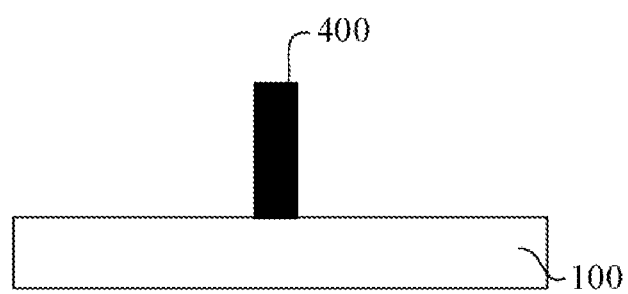
FIG. 22 is a cross-sectional view of a structure of an intermediate product formed in a step S07 of the manufacturing method of a metal grid according to an embodiment of the present disclosure.

An embodiment of the present disclosure further provides a manufacturing method of a metal grid. FIG. 19 is a cross-sectional view of a structure of an intermediate product formed in a step S04 of the manufacturing method of a metal grid in an embodiment of the present disclosure. FIG. 20 is a cross-sectional view of a structure of an intermediate product formed in a step S05 of the manufacturing method of a metal grid in an embodiment of the present disclosure. FIG. 21 is a cross-sectional view of a structure of an intermediate product formed in a step S06 of the manufacturing method of a metal grid in an embodiment of the present disclosure. FIG. 22 is a cross-sectional view of a structure of an intermediate product formed in a step S07 of the manufacturing method of a metal grid in an embodiment of the present disclosure. The manufacturing method includes the following steps:

S01, providing a base substrate 100.

This step may be the same as the step S1 described above, and thus will not be described in detail herein.

S02, forming a metal film layer 40 and a protective layer on the base substrate 100 sequencely.

Forming the metal film layer 40 in the step S02 may include, but is not limited to, sputtering. The protective layer includes, but is not limited to, an organic dielectric layer.

S03, forming a first dielectric layer 200 on a side of the protective layer away from the base substrate 100, wherein the first dielectric layer 200 has a first groove 201.

The step S03 may include the steps S21-S24, and thus will not be described in detail herein.

S04, forming a second dielectric layer 300 on a side of the first dielectric layer 200 away from the base substrate 100 to form a second groove 301, as shown in FIG. 19.

The step S04 may be the same as the step S3 of forming the second dielectric layer, and thus will not be described in detail herein.

S05, removing a bottom wall of the second groove 301 and a part of the protective layer corresponding to the bottom wall of the second groove 301, as shown in FIG. 20.

In the step S05, the bottom wall of the second groove 301 and the part of the protection layer corresponding to the bottom wall of the second groove 301 may be removed by wet etching, so as to expose a part of the metal film layer 40 at a position of the second groove 301.

S06, performing an electroplating process with the metal film layer 40 as a seed layer such that a metal material is formed in the second groove, as shown in FIG. 21.

The electroplating process in the step S06 is the same as the step S42, and therefore, will not be described in detail herein.

S07, removing the first dielectric layer 200, the second dielectric layer 300, the protective layer and a part of the metal film layer 40 except the metal material in the second groove 301 on the base substrate 100, to form a metal grid 400, as shown in FIG. 22.

Of course, after the metal grid 400 is formed, a passivation layer 500 may be further formed on a side of the metal grid 400 away from the base substrate 100 to protect the metal grid 400, so as to prevent the metal grid 400 from being corroded by water and oxygen.

In a second aspect, an embodiment of the present disclosure further provides a manufacturing method of a thin film sensor, including, but not limited to, a transparent antenna, and the manufacturing method of the thin film sensor may include the above-described manufacturing method of the metal grid 400.

Since the manufacturing method of the thin film sensor in an embodiment of the present disclosure includes the manufacturing method of the metal grid 400, the light transmittance of the thin film sensor formed by this method is high, and the influence on the optical effect of the display device after the thin film sensor is applied to the display device is significantly reduced.

In a third aspect, an embodiment of the present disclosure further provides a thin film sensor, which may be manufactured using the above method. The thin film sensor includes, but is not limited to, a transparent antenna. The metal grid in the thin film sensor in an embodiment of the present disclosure is prepared by the above method, so the line width of the metal grid is not greater than 2 μm, for example, less than 1.5 μm. The thickness of the metal grid 400 in an embodiment of the present disclosure is not less than the thickness of the second dielectric layer 300.

Referring to FIG. 8, the thin film sensor specifically includes a base substrate 100, a second dielectric layer 300, and a metal grid 400 on the second dielectric layer 300. In this case, the metal grid 400 and the second dielectric layer 300 have the same pattern, and their orthographic projections on the base substrate 100 completely overlap with each other. It should be noted that, in an embodiment of the present disclosure, the up-down relationships of the formed structure are defined according to the sequence of depositing the film layers in the manufacturing method. For example, the deposition layer of the second dielectric layer 300 is formed before the metal grid 400, so the metal grid is considered to be located on the second dielectric layer 300.

Referring to FIG. 13, the thin film sensor specifically includes a base substrate 100, a first dielectric layer 200 disposed on the base substrate 100, a second dielectric layer 300 disposed on the first dielectric layer 200, and a metal grid 400 located on the second dielectric layer 200. In this case, the metal grid 400 is formed in the second groove 301 of the second dielectric layer 200. In addition, an outer wall of the metal grid 400 is wrapped by the first dielectric layer 200 and the second dielectric layer 300, so that the metal grid may be protected.

Figure 18:
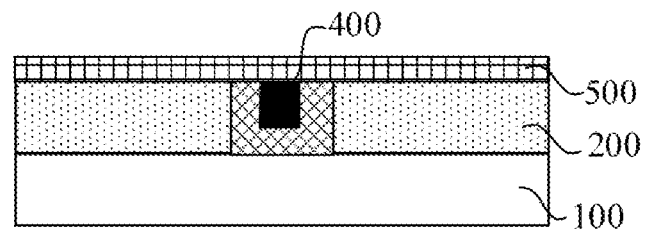
FIG. 18 is a cross-sectional view of a structure of a metal grid formed by the manufacturing method of a metal grid according to an embodiment of the present disclosure.

In some examples, as shown in FIG. 18, the thin film sensor further includes a passivation layer 500 covering a side of the metal grid 400 away from the base substrate to protect the metal grid 400, so as to prevent the metal grid 400 from being corroded by water and oxygen.

It will be understood that the above embodiments are merely exemplary embodiments adopted to illustrate the principles of the present invention, and the present invention is not limited thereto. It will be apparent to those skilled in the art that various modifications and improvements may be made without departing from the spirit and scope of the invention, and such modifications and improvements are also considered to be within the scope of the invention.

What is claimed is:

1. A manufacturing method of a metal grid, comprising:
   providing a base substrate;
   forming a pattern comprising a first dielectric layer on the base substrate through a patterning process such that the first dielectric layer has a first groove in a lattice shape;
   forming a second dielectric layer on a side of the first dielectric layer away from the base substrate such that the second dielectric layer is deposited at least on a sidewall of the first groove to form a second groove in a lattice shape; and
   forming a metal material in the second groove, and removing at least a part of a material of the second dielectric layer such that an orthographic projection of the part of the material of the second dielectric layer on the base substrate does not overlap with an orthographic projection of the metal material on the base substrate, to form a metal grid,
   wherein the forming a metal material in the second groove comprises:
   forming a metal film layer on the base substrate as a seed layer before the forming a pattern comprising a first dielectric layer on the base substrate through a patterning process;
   forming a protective layer on a side of the seed layer away from the base substrate;
   after the forming a second dielectric layer on a side of the first dielectric layer away from the base substrate, removing a bottom wall of the second groove and a part of the protective layer at a position of the bottom wall of the second groove; and
   performing an electroplating process on the seed layer to form the metal material in the second groove.

2. The manufacturing method according to claim 1, wherein the forming a pattern comprising a first dielectric layer on the base substrate through a patterning process comprises:
   forming a first material layer and a second material layer on the base substrate sequentially;
   patterning the second material layer to form a sacrificial layer having a lattice-shaped hollow out pattern;
   removing a part of a first material of the first material layer at a position corresponding to the lattice-shaped hollow out pattern of the sacrificial layer through a patterning process; and
   removing the sacrificial layer to form the first dielectric layer.

3. The manufacturing method according to claim 2, wherein the first material layer comprises a low-temperature organic curing adhesive; and
   the forming a first material layer and a second material layer on the base substrate comprises:
   coating the low-temperature organic curing adhesive on the base substrate by a spin coating method, and curing the low-temperature organic curing adhesive; and
   depositing a second material of the second material layer on a side of the cured low-temperature organic curing adhesive away from the base substrate.

4. The manufacturing method according to claim 1, wherein the forming a metal material in the second groove comprises:
   forming a metal film layer as a seed layer on a side of the second dielectric layer away from the base substrate;
   performing an electroplating process on the seed layer to form a metal material both in the second groove and on a side of the second dielectric layer away from the base substrate; and
   removing at least a part of the metal material outside the second groove.

5. The manufacturing method according to claim 4, wherein the removing at least a part of the metal material outside the second groove comprises:
   removing the part of the metal material outside the second groove, and removing a part of the metal material with a predetermined thickness in the second groove.

6. The manufacturing method according to claim 1, wherein the forming a metal material in the second groove comprises:
   forming a metal film layer on a side of the second dielectric layer away from the base substrate, through an evaporation process; and
   removing at least a part of the metal material outside the second groove by an etching process.

7. The manufacturing method according to claim 1, wherein the removing at least a part of a material of the second dielectric layer such that an orthographic projection of the part of the material of the second dielectric layer on the base substrate does not overlap with an orthographic projection of the metal material on the base substrate comprises:

removing a part of the second dielectric layer such that an orthographic projection of the part of the material of the second dielectric layer on the base substrate does not overlap with an orthographic projection of the metal material on the base substrate, by wet etching; and removing the first dielectric layer by dry etching.

8. The manufacturing method according to claim 1, wherein after forming the metal grid, the manufacturing method further comprises:

forming a passivation layer on a side of the metal grid away from the base substrate.

9. The manufacturing method according to claim 1, wherein the first dielectric layer has a thickness of 2 μm to 3 μm.

10. The manufacturing method according to claim 1, wherein the first groove in the first dielectric layer has a width of 3 μm to 4 μm and a depth of 2 μm to 3 μm.

11. The manufacturing method according to claim 1, wherein a width of the second groove is not greater than 1.5 μm.

12. A manufacturing method of a thin film sensor, comprising the manufacturing method according to claim 1.

* * * * *